United States Patent
Grodzki

(10) Patent No.: US 9,494,662 B2
(45) Date of Patent: Nov. 15, 2016

(54) MAGNETIC RESONANCE METHOD AND APPARATUS FOR AUTOMATIC CALCULATION OF A MAXIMUM PULSE-LENGTH OF AN EXCITATION PULSE

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 573 days.

(21) Appl. No.: 14/039,264

(22) Filed: Sep. 27, 2013

(65) Prior Publication Data

US 2014/0091795 A1    Apr. 3, 2014

(30) Foreign Application Priority Data

Sep. 28, 2012  (DE) .................. 10 2012 217 819

(51) Int. Cl.
  *G01R 33/28*   (2006.01)
  *G01R 33/54*   (2006.01)
  *G01R 33/565*  (2006.01)

(52) U.S. Cl.
  CPC .......... *G01R 33/288* (2013.01); *G01R 33/543* (2013.01); *G01R 33/5659* (2013.01)

(58) Field of Classification Search
  CPC .............. G01R 33/288; G01R 33/543; G01R 33/5659
  See application file for complete search history.

(56) References Cited

U.S. PATENT DOCUMENTS

| | | | |
|---|---|---|---|
| 6,566,873 B1* | 5/2003 | Smith ............... | G01R 33/441 324/300 |
| 2006/0017437 A1 | 1/2006 | Vu | |
| 2011/0133735 A1* | 6/2011 | Yokosawa ............. | A61B 5/055 324/307 |
| 2013/0101198 A1 | 4/2013 | Grodzki et al. | |

OTHER PUBLICATIONS

Grodzki et al., "Correcting slice selectivity in hard pulse sequences," Journal of Magnetic Resonance, vol. 214 (2012) pp. 61-67.
Nielles-Vallespin et al., "3D Radial Projection Technique With Ultrashort Echo Times for Sodium MRI. Clinical Applications in Human Brain and Skeletal Muscle," Magnetic Resonance in Medicine, vol. 57 (2007), pp. 74-81.
Grodzki et al., "Ultra short Echo Time Imaging using Pointwise Encoding Time reduction with Radial Acquisition (PETRA)," Proc. Intl. Soc. Mag. Reson. Med., vol. 19 (2011), p. 2815.
Weiger et al., "MRI with Zero Echo Time: Hard versus Sweep Pulse Excitation," Magnetic Resonance in Medicine, vol. 66 (2011), pp. 379-389.
Grodzki et al., "Ultrashort Echo Time Imaging Using Pointwise Encoding Time Reduction With Radial Acquisition (PETRA)," Magnetic Resonance in Medicine (2011), pp. 1-9.

* cited by examiner

*Primary Examiner* — Rodney Bonnette
(74) *Attorney, Agent, or Firm* — Schiff Hardin LLP

(57) ABSTRACT

In a method and magnetic resonance apparatus for automatic calculation of a maximum pulse length of a non-selective excitation pulse for a magnetic resonance data acquisition pulse sequence in which gradients are switched during the radiation of at least one non-selective excitation pulse, a first parameter, which indicates the field of view (FOV) desired in the measurement for which the pulse length of the excitation pulse should be maximized, is loaded into a processor, and a second parameter, which indicates the maximum gradient strength ($G_{max}$) which corresponds to the highest gradient strength applied in the entire measurement, is also loaded into the processor. The processor then calculates the maximum pulse length of the excitation pulse on the basis of the first and second parameter. By the maximization of the pulse length, the SAR exposure is reduced for the examination subject from whom the magnetic resonance data are acquired with the pulse sequence.

9 Claims, 3 Drawing Sheets

MAGNETIC RESONANCE METHOD AND APPARATUS FOR AUTOMATIC CALCULATION OF A MAXIMUM PULSE-LENGTH OF AN EXCITATION PULSE

BACKGROUND OF THE INVENTION

1. Field of the Invention

The present invention concerns: a method to automatically calculate a maximum pulse length of an excitation pulse for a magnetic resonance examination, as well as a magnetic resonance apparatus and an electronically readable data storage medium for implementing such a method.

2. Description of the Prior Art

Magnetic resonance (MR) is a known modality with which images of the inside of an examination subject can be generated. Expressed in a simplified form, the examination subject is positioned in a strong, static, homogeneous basic magnetic field (also called a $B_0$ field) with a field strength from 0.2 Tesla to 7 Tesla or more in a magnetic resonance apparatus, such that the nuclear spins of the examination subject orient along the basic magnetic field. To trigger magnetic resonance signals, radio-frequency excitation pulses (RF pulses) are radiated into the examination subject, and the triggered magnetic resonance signals are detected and entered at data points in an electronic memory organized in a manner known as k-space images are reconstructed or spectroscopy data are determined from the k-space data. For spatial coding of the measurement data, rapidly switched magnetic gradient fields are superimposed on the basic magnetic field. The acquired measurement data are digitized and stored as complex numerical values in a k-space matrix in the memory. An associated MR image can be reconstructed from the k-space matrix populated with values, for example by a multidimensional Fourier transformation.

Sequences with very short echo times TE—for instance TE less than 0.5 milliseconds—offer new fields of application for nuclear magnetic resonance tomography. They enable the depiction of substances that cannot be depicted with conventional sequences such as (T)SE ((Turbo) Spin Echo) or GRE (gradient echo) since their respective decay time of the transversal magnetization M2 is markedly shorter than the possible echo times of the conventional sequences, and their signal has therefore already decayed at the point in time of acquisition. In contrast, with echo times in the range of these decay times it is possible to depict the signals of these substances in an MR image, for example. The decay times T2 of teeth, bones or ice lie between 30 and 80 microseconds, for example.

The application of sequences with ultrashort echo times (UEZ sequences) enables (for example) bone and/or dental imaging and/or the depiction of cryoablations by means of MR, and is usable for MR-PET (combination of MR and positron emission tomography, PET) or PET attenuation correction.

Examples of UEZ sequences are: UTE ("Ultrashort Echo Time"), for example as it is described in the article by Sonia Nielles-Vallespin, "3D radial projection technique with ultrashort echo times for sodium MRI: Clinical applications in human brain and skeletal muscle", Magn. Res. Med. 2007, 57, Pages 74-81; PETRA ("Pointwise Encoding Time reduction with Radial Acquisition") as it is described by Grodzki et al. in "Ultra short Echo Time Imaging using Pointwise Encoding Time reduction with Radial Acquisition (PETRA)", Proc. Intl. Soc. Mag. Reson. Med. 19 (2011), Page 2815; or z-TE as it is described by Weiger et al. in "MRI with zero echo time: hard versus sweep pulse excitation", Magn. Reson. Med. 66 (2011), Pages 379-389.

In these sequences, usually a hard delta pulse is radiated as a radio-frequency excitation pulse and the data acquisition is subsequently begun. In PETRA or z-TE, the gradients are already activated during the excitation. The spectral profile of the excitation pulse hereby corresponds approximately to a sin c function. Given insufficient pulse bandwidth or too-strong gradients, it can occur that the outer image regions are no longer sufficiently excited. In the reconstructed MR image, this incorrect excitation has the effect of blurring artifacts at the image edge, which are more strongly pronounced the stronger the gradients that are switched during the excitation.

An insufficient excitation thus leads to artifact-plagued MR images. This problem has previously for the most part been negligible. At most, it is sought to optimally reduce the strength of the gradients. However, imaging-relevant variables (such as the readout bandwidth, the repetition time TR and the contrast of the image) therefore change as well. For example, a reduction of the gradient strength increases the minimum necessary repetition time TR, and therefore also the total measurement time. Such artifacts could furthermore be reduced in that the excitation pulses are chosen to be particularly short in order to increase the excitation width. However, the maximum possible flip angle and the precision of the actual emitted RF excitation pulse are therefore simultaneously reduced proportional to the duration of the RF excitation pulse. For example, given a duration of the excitation pulse of 14 microseconds the maximum flip angle is approximately 9°, and given a reduced duration of the excitation pulse to 7 microseconds it would be only approximately 4.5°. Therefore, this procedure is also not usable without limitation and causes a degradation of the image quality.

SUMMARY OF THE INVENTION

An object of the invention is to provide a method to automatically calculate a maximum pulse length of an RF excitation pulse in a magnetic resonance data acquisition sequence, as well as a magnetic resonance apparatus, and an electronically readable data storage medium to implement such a method, in order to enable a reliable correction of artifacts caused by insufficient excitation, wherein at the same time the SAR (specific absorption rate) exposure of the examination subject due to the measurement (data acquisition) is optimally low.

A method according to the invention for the automatic calculation of a maximum pulse length of a non-selective excitation pulse for a pulse sequence in which gradients are switched simultaneously during the radiation of the non-selective excitation pulse includes the following steps. A first parameter, which indicates the field of view (FOV) desired in the measurement for which the pulse length of the excitation pulse should be maximized, is loaded into a processor. A second parameter, which indicates the maximum gradient strength ($G_{max}$) which can be achieved with the magnetic resonance system used for the measurement, is also loaded into the processor. The processor calculates the maximum pulse length of the excitation pulse on the basis of the first and second parameter.

By maximizing the pulse length, the SAR load drops for the examination subject which is examined by means of a pulse sequence whose pulse length has been calculated according to the invention.

The invention is based on the following considerations.

Given measurements with gradients switched during the excitation, the excited region changes with each repetition because different gradient configurations are switched at each repetition. This leads to disturbances since—for example given a repetition with a gradient configuration of Gx=0 and Gy=G—an image resulting from this measurement point is superimposed with a sin c function which is symmetrical in the y-direction, corresponding to the incorrect excitation; in contrast to which—given a repetition with a gradient configuration of, for example, Gx=G and Gy=0—an image resulting from this measurement point is superimposed with a sin c function which is symmetrical in the y-direction, corresponding to the incorrect excitation.

The dependency of the excitation profile in the x-direction (specified in millimeters "mm"), and therefore the produced excitation P(k,x) (specified in arbitrary units ("a.U.")) of a currently applied gradient strength G1, G2, G3, G4, G5 is presented as an example in FIG. 1. In the shown example, G5>G4>G3>G2>G1 applies. As is apparent, the excitation profile is broader the lower the applied gradient strength. The broadest excitation profile (drawn with solid line), i.e. an optimally homogeneous excitation (P(k,x)) over the largest spatial region (x), is therefore achieved at G1. The narrowest excitation profile (drawn with a double dash-dot line), which already entails a drastic change in the excitation (P(k,x)), is obtained at G5.

Mathematically, the problem can be described as follows. In MR measurements, what is known as k-space F(k) is scanned which corresponds to the examination region of the subject that is to be measured that is to be imaged, wherein:

$$F(k) = \int f(x) e^{ikx} dx. \quad (1)$$

in which f(x) describes the signal of the subject to be measured. [sic] And k-space F(k) is filled with the acquired measurement data. The image I(x) is calculated via Fourier back-transformation from k-space filled with the measurement data:

$$I(x) = f(x) = \int F(k) e^{-ikx} dk. \quad (2)$$

In the event of insufficient excitation, instead of desired k-space F(k) disturbed k-space F'(k) is measured, i.e. populated with the measurement data. In disturbed k-space F'(k), the signal of the subject f(x) to be measured is superimposed with a disturbance function P(k,x) which corresponds to the spectral form of the actual excitation pulse (thus the excitation profile):

$$F'(k) = \int f(x) P(k,x) e^{ikx} dx. \quad (3)$$

The excitation profile P(k,x) thereby depends both on the location x and the measured k-space point, and on the gradient strength. The excitation profile of an excitation pulse corresponds essentially to the Fourier transform of the pulse shape of the excitation pulse in time/space p(t); in the example shown using FIG. 1, the excitation profiles respectively correspond to a sin c function, for example as result given "hard" rectangular excitation pulses p(t) which have a constant value (for example B1) not equal to zero only during the duration r of the excitation pulse:

A rectangular excitation pulse $$p(t) = \begin{cases} B1, & \text{for } |t| < \tau/2 \\ 0, & \text{otherwise.} \end{cases}$$

corresponds in frequency space to a sin c-shaped spectral excitation pulse P(ω) with $$P(\omega) = \frac{\sin\left(\frac{1}{2}\omega\tau\right)}{\frac{1}{2}\omega\tau} = \text{sinc}\left(\frac{1}{2}\omega\tau\right)$$

and a phase factor.

In the presence of switched gradients, the resonance frequency ω is a function of the location (here represented by x) in the image domain:

$$\omega = 2\pi\gamma\omega G,$$

wherein γ is the gyromagnetic ratio and G is the strength of the applied gradients.

For gradients varying in the course of the MR pulse sequence (for example give various repetitions), ω is also a function of the read-out k-space point k, which is why the excitation profile can also be written as P(ω)=P(k,x).

A disturbed MR image I'(x) that is plagued with artifacts can be reconstructed from disturbed k-space F'(k):

$$I'(x) = \int F'(k) e^{-ikx} dk. \quad (4)$$

According to the invention, the disturbing influence of the incorrect excitation pulse can be computed out of the measured measurement data in that the excitation error is calculated in a disturbance matrix $D_{kx}$ and the error of the excitation is subsequently corrected via inversion of the disturbance matrix $D_{kx}$.

If Equation (3) is written as a sum (discrete values are actually measured) and the disturbance matrix $$D_{kx} = P(k,x) e^{ikx} \quad (5)$$

is defined with N×N elements (wherein N is a natural number), Equation (3) can be written in matrix form:

$$F'_k = D_{kx} f_x. \quad (6)$$

The disturbance matrix $D_{kx}$ thus reflects an excitation profile of the excitation pulse used to acquire the measurement data. The elements of Equation (5) are known and can be calculated from the form of the excitation pulse, the location x to be excited and read-out k-space point k, as well as the applied gradient G. Perturbed k-space F'(k) is measured. The disturbed image I(x) can therefore be calculated via matrix inversion of $D_{kx}$ and matrix multiplication with distorted k-space:

$$f_x = I_x = D_{kx}^{-1} F'_k. \quad (7)$$

The calculation of a corrected image $I_x$ (x) includes a matrix multiplication of the disturbance matrix $D_{kx}^{-1}$, inverted via the matrix inversion, with the measurement data acquired in k-space $F'_k$.

Instead of a Fourier back-transformation, a matrix inversion can thus be used for the image reconstruction of a corrected image. However, the calculation of the disturbance matrix $D_{kx}$ as a whole and its subsequent inversion require an increasing computing cost which claims a lot of computing power and also computing time. Moreover, for matrix inversion with conventional methods the points of measurement data acquired in k-space (for example also of projections) must be arranged symmetrically around the k-space center, and the center point must correspond to the k-space center.

Instead of initially calculating the disturbance matrix $D_{kx}$ as just described and then inverting it as a whole, individual elements of the transposed, inverted disturbance matrix can also be calculated from the excitation profiles used in the measurement. In a simple example, the calculation of an element of the transposed, inverted disturbance matrix $D_{xk}^{-1}$ includes an inversion of the associated excitation profile $P(k,x)$ into $1/P(k,x)$.

The calculation of the elements of the transposed, inverted disturbance matrix $D_{xk}^{-1}$ can additionally include a multiplication with a phase factor $e^{-ikx}$.

A calculation according to the invention of an element of the transposed, inverted disturbance matrix $D_{xk}^{-1}$ therefore results, in particular from the formula:

$$D_{xk}^{-1} = \frac{1}{P(k,x)} e^{-ikx} \qquad (8)$$

for all locations x and all k-space points k, and $$D_{kx}^{-1} = (D_{xk}^{-1})^T, \qquad (9)$$

with which the inverted disturbance matrix $D_{kx}^{-1}$ that is required for the calculation of the undisturbed image I(x) according to Formula (1) results via transposition of the transposed, inverted disturbance matrix $D_{xk}^{-1}$.

Such corrections by means of matrix inversion deliver particularly reliable results when the first minimum $r_0$ of the excitation profile $P(k,x)$ lies outside of the examination subject to be measured—i.e. outside of the desired field of view (FOV)—at the strongest gradient strength used within the scope of the measurement.

The position of the first minimum $r_0$ can be determined from the condition as:

$$r_0 = \frac{\sqrt{3}}{2} FOV. \qquad (10)$$

The calculation of the maximum pulse length thus can take place on the basis of the specification that the first minimum of the excitation $P(k,x)$ that is achieved with the excitation pulse lies outside of the desired field of view (FOV). This condition simultaneously ensures that a correction described above operates particularly reliably by means of a matrix inversion.

In general, the first minimum $r_0$ is provided by:

$$r_0 = (\gamma \tau G_{max})^{-1}, \qquad (11)$$

wherein γ designates the gyromagnetic ratio of the spins prevailing in the examination subject to be examined—in examinations of patients, normally as the gyromagnetic ratio of protons; T designates the pulse length; and $G_{max}$ designates the maximum gradient strength.

If Formula (11) is solved for the pulse length and the condition (10) is used for the first minimum of the excitation r0, the maximum pulse length $\tau_{max}$ results as:

$$\tau_{max} = (\gamma r_0 G_{max})^{-1} = \frac{2}{\sqrt{3}} \frac{1}{\gamma FOV G_{max}}. \qquad (12)$$

The calculation of the maximum pulse length thus depends on the gyromagnetic ratio of the spins predominantly located in the subject to be examined, and includes a calculation of the inverse of the first parameter (FOV) and a calculation of the inverse of the second parameter ($G_{max}$).

The maximum pulse length can accordingly be calculated via a multiplication of the inverse of the first parameter with the inverse of the second parameter, the inverse of the gyromagnetic ratio of the spins predominantly located in the subject to be examined, and a geometric factor.

A magnetic resonance system according to the invention has a basic field magnet, a gradient field system, an RF antenna, and a control device to control the gradient field system and the RF antenna, and an image computer to receive the measurement signals received by the RF antenna, to evaluate the measurement signals and to create magnetic resonance images. The control device has a pulse length determination device to calculate the maximum pulse length for a pulse sequence.

In one exemplary embodiment, the control device of the magnetic resonance system furthermore has a calculation device to calculate elements of a matrix to correct artifacts in magnetic resonance images and a correction device to correct artifacts in magnetic resonance images which were acquired by means of an MR pulse sequence in which gradients are switched simultaneously during the radiation of at least one non-selective excitation pulse.

The magnetic resonance system is designed to implement the method according to the invention as described herein.

An electronically readable data storage medium according to the invention is encoded with programming instructions that cause the electronically readable control information stored thereupon, which control information method according to the invention as described herein to be executed when the data storage medium is loaded into an run in a control device of a magnetic resonance system.

The described advantages and embodiments with regard to the method apply analogously to the magnetic resonance system, the electronically readable data storage medium.

DESCRIPTION OF THE PREFERRED EMBODIMENTS

Figure 1:
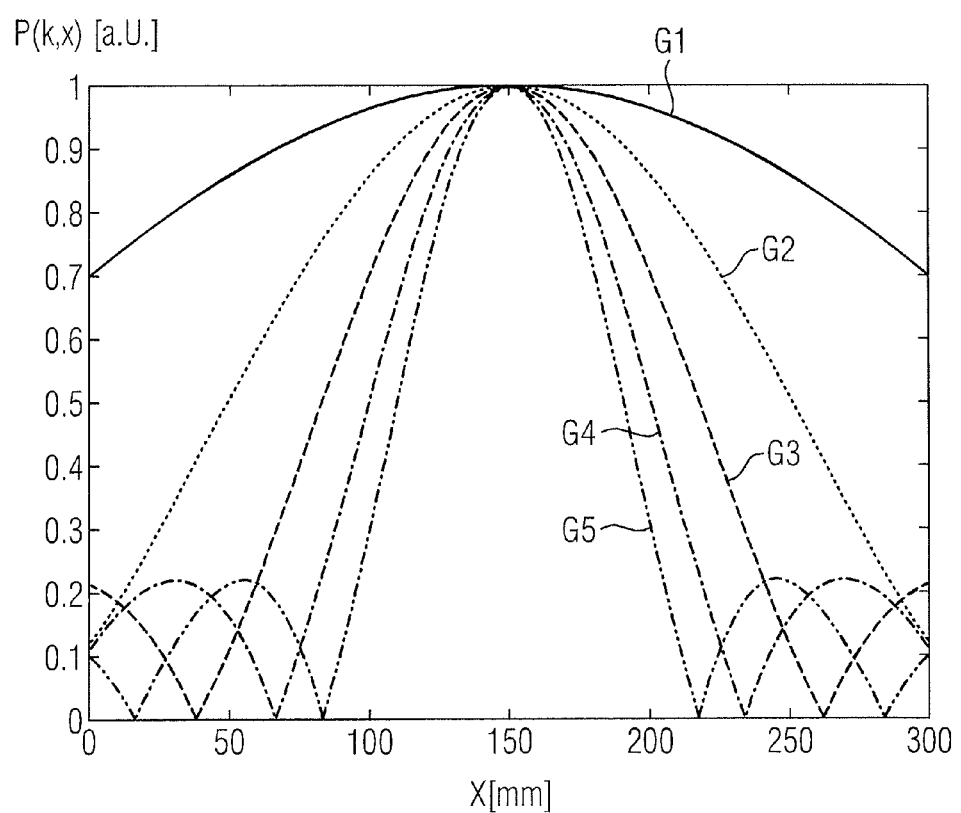
FIG. 1 depictions the influence of the applied gradient strength on the excitation profile of an excitation pulse.
Figure 2:
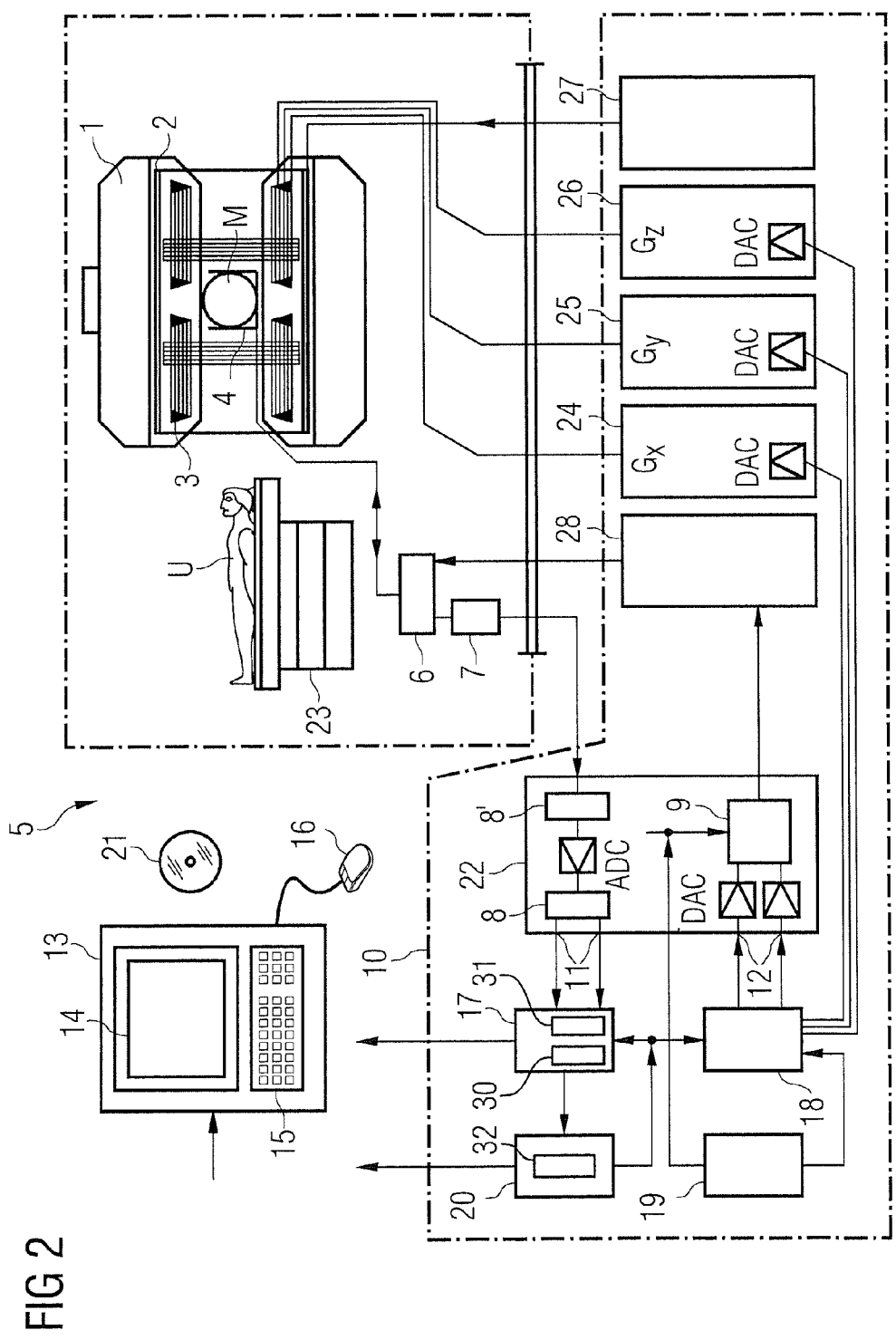
FIG. 2 schematically illustrates a magnetic resonance system according to the invention.

FIG. 2 shows a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in an examination region of an examination subject U (for example a part of a human body that is to be examined) which lies on a table 23 and is slid into the magnetic resonance system 5. The high homogeneity of the basic magnetic field that is required for the magnetic resonance measurement (data acquisition) is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 2 and a suitable activation 27 for the shim coils 2.

In the basic field magnet 1, a cylindrical gradient coil system 3 is used which comprises three sub-windings. Each sub-winding is supplied by a corresponding amplifier 24-26 with current to generate a linear gradient field in the respective directions of the Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. The amplifiers 24-26 each include a digital/analog converter (DAC) that is controlled by a sequence controller 18 for accurately-timed generation of gradient pulses.

Located within the gradient field system 3 is a radio-frequency antennas 4 which converts the radio-frequency pulses emitted by a radio-frequency power amplifier into an alternating magnetic field for excitation of the nuclei and alignment of the nuclear spins of the subject to be examined or of the region of the subject that is to be examined. The radio-frequency antenna 4 comprises one or more RF transmission coils and one or more RF reception coils in the form of an arrangement (for example annular, linear or matrix-like) of component coils. The alternating field emanating from the precessing nuclear spins—i.e. normally the spin echo signals caused by a pulse sequence made up of one or more radio-frequency pulses and one or more gradient pulses—is also converted by the RF reception coils of the radio-frequency antenna 4 into a voltage (measurement signal) which is supplied via an amplifier 7 to a radio-frequency reception channel 8, 8' of a radio-frequency system 22. The radio-frequency system 22 furthermore has a transmission channel 9 in which the radio-frequency pulses are generated for the excitation of the magnetic resonance signals. The respective radio-frequency pulses are thereby digitally represented in the sequence controller 18 as a series of complex numbers based on a pulse sequence predetermined by the system computer 20. This number sequence is supplied as a real part and imaginary part to a digital/analog converter (DAC) in the radio-frequency system 22 via respective inputs 12, and from the digital/analog converter to the transmission channel 9. The control device 10—or directly the system computer 20—has a pulse length determination device 32 with which a maximum pulse length according to the invention is calculated. In the transmission channel 9, the pulse sequences are modulated on a radio-frequency carrier signal whose base frequency corresponds to the center frequency. The modulated pulse sequences are supplied via an amplifier 28 to the RF transmission coil of the radio-frequency antenna 4.

The switching from transmission operation to reception operation takes place via a transmission/reception diplexer 6. The RF transmission coil of the radio-frequency antenna 4 radiates the radio-frequency pulses for excitation of the nuclear spins into the measurement volume M and scans resulting echo signals via the RF reception coils. The correspondingly acquired magnetic resonance signals are phase-sensitively demodulated to an intermediate frequency in a first demodulator 8' of the reception channel of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain, which second demodulator 8 outputs the demodulated data via outputs 11 to an image computer 17. An MR image is reconstructed by the image computer 17 from the measurement data acquired in such a manner, in particular using the method according to the invention, for which the control unit 10 comprises, for example, a calculation device 31 for the calculation according to the invention of elements of a matrix to correct artifacts in magnetic resonance images and a correction device 30 to correct artifacts in magnetic resonance images which were acquired by means of an MR pulse sequence in which gradients are switched (activated) during the radiation of at least one non-selective excitation pulse. This calculation device 31 and/or the correction device 30 are, for example, embodies in the image computer 17. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an acquisition of measurement data (which control programs are stored on a DVD 21, for example), as well as other inputs on the part of the user and the presentation of the generated MR image, take place via a terminal 13 that includes input means—for example a keyboard 15 and/or a mouse 16—to enable an input and display means—for example a monitor 14—to enable a display.

Figure 3:
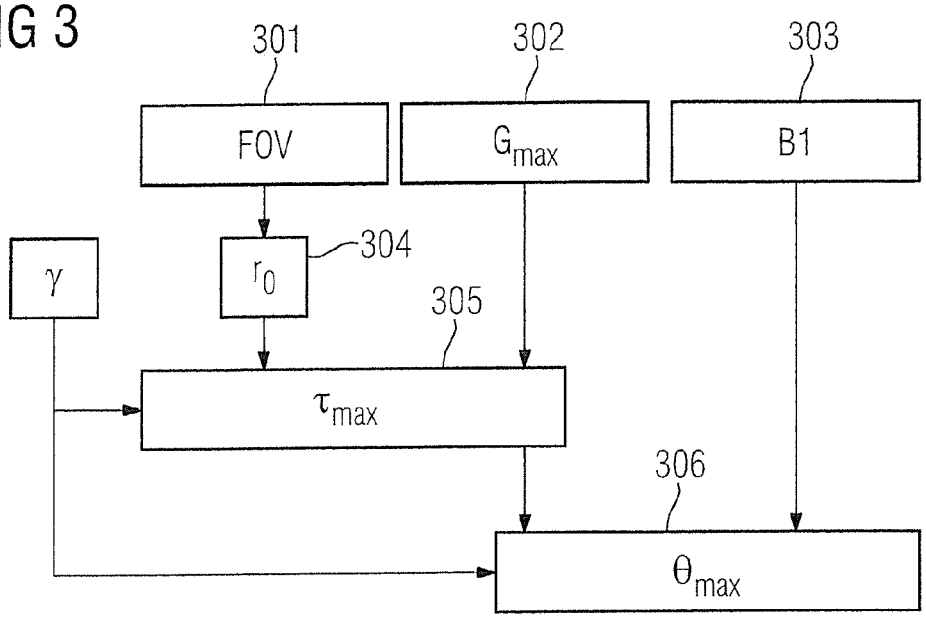
FIG. 3 is a flowchart of an embodiment of the method according to the invention for the calculation of a maximum pulse length of a non-selective excitation pulse.

Shown in FIG. 3 is a flowchart of a method according to the invention for the automatic calculation of a maximum pulse length of a non-selective excitation pulse for a pulse sequence in which gradients are switched simultaneously during the radiation of at least one non-selective excitation pulse.

A first parameter FOV, which indicates the field of view desired in the measurement for which the pulse length of the excitation pulse should be maximized, is thereby loaded (Block 301). Furthermore, a second parameter $G_{max}$ is loaded which indicates the maximum gradient strength, which corresponds to the highest gradient strength applied in the entire measurement (Block 302). $G_{max}$ cannot be greater than the gradient strength value that can be achieved at maximum with the magnetic resonance system used for the measurement.

The maximum pulse length of the excitation pulse can now be calculated (Block 305) on the basis of the first parameter FOV and the second parameter $G_{max}$. The gyromagnetic ratio $\gamma$ of the spins predominantly located in the subject to be examined also enters into the calculation of the maximum pulse length (Block 305) according to Formula (12).

The maximum pulse length is accordingly calculated by multiplication of the inverse of the first parameter with the inverse of the second parameter, the inverse of the gyromagnetic ratio of the spins predominantly located in the subject to be examined, and a geometric factor.

According to Formula (10), as an intermediate step a position of the first minimum $r_0$ of the excitation P(k,x) generated with the excitation pulse can be calculated on the basis of the first parameter FOV, for which a correction method by means of matrix inversion as indicated above works particularly reliably (Block 304).

Furthermore, a third parameter B1 can be loaded which indicates the maximum alternating magnetic field (B1) which can be achieved at maximum with the radio-frequency antenna to be used (Block 303).

Furthermore, a maximum flip angle $\theta_{max}$ can be calculated (Block 306) on the basis of the third parameter B1 and the calculated maximum pulse length.

In general the flip angle $\theta$ results from the gyromagnetic ratio $\gamma$ of the spins predominating in the examination subject, the alternating magnetic field B1 that is used and the pulse length $\tau$ of the excitation pulse that is used:

$$\theta = \gamma B 1 \tau. \tag{13}$$

For the maximum flip angle $\theta_{max}$ achievable with the maximum pulse length $\tau_{max}$, it thus applies that:

$$\theta_{max} = \gamma B 1 \tau_{max} = \frac{2}{\sqrt{3}} \frac{B1}{FOVG_{max}}. \tag{14}$$

The maximum flip angle can thus be calculated by means of a multiplication of the inverse of the first parameter FOV, the inverse of the second parameter $G_{max}$ with the third parameter B1, and a geometric factor.

For example, given a measurement of a head as an examination subject by means of a PETRA sequence in which a maximum gradient strength $G_{max}=8$ mT/m is used, and the field of view (corresponding to the dimension of the head to be measured) amounts to approximately 300 mm, a first minimum of the excitation $r_0$ results at approximately $r_0=260$ mm.

A maximum pulse duration $\tau_{max}$ of 19 μs therefore results according to Formula (12).

If a body coil with a maximum alternating magnetic field of B1=40 mT/m is hereby used, according to Formula (13) this leads to a maximum flip angle of 8.5°.

When an excitation pulse with a maximum pulse length according to the invention is used, higher flip angles can be achieved than given the use of shorter excitation pulses. If a higher flip angle is not required or desired, the strength of the alternating magnetic field B1 that is used can be reduced via use of an excitation pulse with a maximum pulse length according to the invention, which contributes to a reduction of the SAR load.

Figure 4:
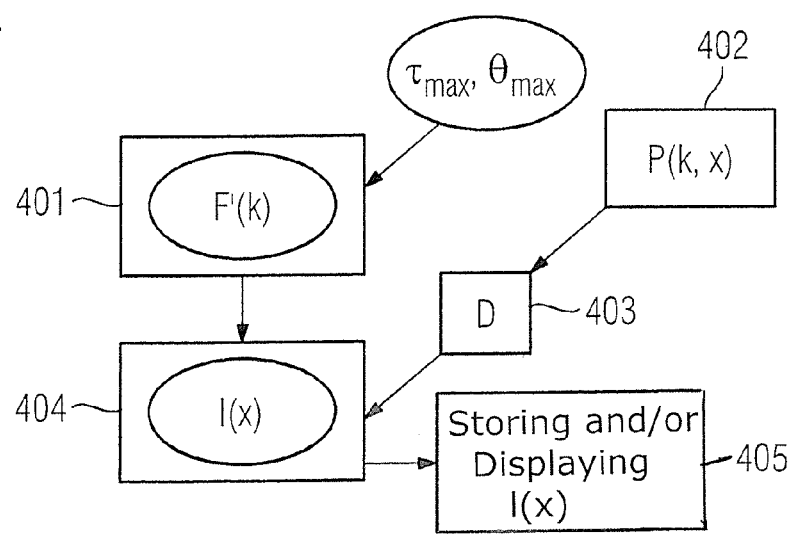
FIG. 4 is a flowchart of an embodiment of the method to correct artifacts in magnetic resonance images which were acquired by means of a pulse sequence in which excitation pulses have been used with a pulse length maximized according to the invention.

FIG. 4 shows a schematic workflow diagram of a method for correction of artifacts in magnetic resonance images which are reconstructed from measurement data which have been acquired by means of a pulse sequence, in which excitation pulses with a maximized pulse length according to the invention have been used.

In Step 401, measurement data acquired with the MR pulse sequence are loaded into k-space F'(k).

In a further Step 402, at least one excitation profile P(k,x) of an excitation pulse used to acquire measurement data is loaded, which excitation profile P(k,x) depends on the measured location x, the measured k-space point k and the gradient strength applied in the measurement.

From each loaded excitation profile P(k,x), according to a method described above at least one element of a matrix D for correction of artifacts is calculated, wherein—in the notation chosen above—the matrix D for correction of artifacts corresponds, for example, to the inverted disturbance matrix $D_{kx}^{-1}$, or to only one element of the transposed, inverted disturbance matrix $D_{xk}^{-1}$ (Block 403).

For example, in a further Step 404 a corrected image I(x) is calculated according to Formula (7) (indicated above) from the acquired measurement data in k-space F'(k) and the matrix D for correction of artifacts.

For example, the corrected image I(x) can be stored and/or displayed (Block 405).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for automatically determining a maximum pulse length of a non-selective excitation pulse for a magnetic resonance data acquisition pulse sequence in which gradient magnetic fields are activated during radiation of at least one non-selective excitation pulse, said method comprising:
   loading a first parameter into a processor that indicates a field of view that is desired in acquisition of magnetic resonance data using said pulse sequence;
   loading a second parameter into said processor that designates a maximum gradient field strength that corresponds to a maximum gradient field strength applied during an entirety of said magnetic resonance data acquisition;
   in said processor, automatically calculating a maximum pulse length of said at least one non-selective excitation pulse in said sequence from said first parameter and said second parameter; and
   making the calculated maximum pulse length available in an electronic form for further processing in said processor.

2. A method as claimed in claim 1 comprising calculating said maximum pulse length so as to satisfy a condition that a first minimum of excitation of nuclear spins achieved with said excitation pulse is outside of said desired field of view.

3. A method as claimed in claim 1 comprising calculating said maximum pulse length additionally dependent on the gyromagnetic ratio of nuclear spins in a subject within said field of view.

4. A method as claimed in claim 1 comprising calculating said maximum pulse length based on an inversion of said first parameter and inversion of said second parameter.

5. A method as claimed in claim 1 comprising:
   loading a third parameter into said processor that designates a maximum alternating radio-frequency field achieved with a radio-frequency antenna that radiates said at least one non-selective excitation pulse; and
   in addition to calculating said maximum pulse length in said processor, calculating a maximum flip angle of said at least one non-selective excitation pulse based on said third parameter.

6. A method to acquire magnetic resonance image data and to correct artifacts therein, comprising:
   for a magnetic resonance data acquisition pulse sequence comprising a non-selective excitation pulse and a gradient that is activated during radiation of said non-selective excitation pulse, calculating a maximum pulse length of said non-selective excitation pulse in a processor by loading a first parameter into said processor that designates a field of view that is desired for acquiring said magnetic resonance data with said pulse sequence, loading a second parameter into said processor that designates a maximum gradient strength of a gradient field produced by activating said gradient, said maximum gradient strength being a highest magnetic field gradient that is activated during an entirety of said data acquisition, and calculating, in said processor, a maximum pulse length from said first and second parameters;

operating a magnetic resonance data acquisition unit to acquire magnetic resonance data with said pulse sequence, including radiating said non-selective excitation pulse with said maximum pulse length, in order to acquire magnetic resonance data into k-space at respective points in k-space;

loading an excitation profile into said processor for each excitation pulse used to acquire said magnetic resonance measurement data, said excitation profile representing said gradient field strength as a function of a measurement location of said magnetic resonance measurement data and the point in k-space at which said magnetic resonance measurement data were entered;

in said processor, for each excitation profile, calculating an element of a transposed, inverted disturbance matrix that corresponds to said location and said point in k-space;

in said processor, applying said transposed, inverted disturbance matrix to the acquired magnetic resonance measurement data in k-space in order to generate a corrected image; and making said corrected image available at an output of said processor in electronic form, as a data file.

7. A magnetic resonance apparatus comprising:

a magnetic resonance data acquisition unit comprising a radio-frequency system and a gradient system;

a control unit configured to operate said magnetic resonance data acquisition unit to acquire magnetic resonance data with a pulse sequence that includes radiating, with said radio-frequency system, at least one non-selective excitation pulse and that includes activating, with said gradient system, a magnetic field gradient during radiation of said at least one non-selective excitation pulse;

a processor loaded with a first parameter that indicates a field of view that is desired in acquisition of magnetic resonance data using said pulse sequence;

said processor being loaded with a second parameter that designates a maximum gradient field strength that corresponds to a maximum gradient field strength applied during an entirety of said magnetic resonance data acquisition;

said processor being configured to automatically calculate a maximum pulse length of said at least one non-selective excitation pulse in said sequence from said first parameter and said second parameter; and said processor being configured to make the calculated maximum pulse length available in an electronic form for further processing in said processor.

8. A non-transitory, computer-readable data storage medium encoded with programming instructions, said data storage medium being loaded into a control and processing system of a magnetic resonance apparatus that also comprises a magnetic resonance data acquisition unit, said programming instructions causing said control and evaluation system to:

receive a first parameter that indicates a field of view that is desired in acquisition of magnetic resonance data using said pulse sequence;

receive a second parameter that designates a maximum gradient field strength that corresponds to a maximum gradient field strength applied during an entirety of said magnetic resonance data acquisition;

automatically calculate a maximum pulse length of said at least one non-selective excitation pulse in said sequence from said first parameter and said second parameter; and make the calculated maximum pulse length available in an electronic form for further processing.

9. A non-transitory, computer-readable data storage medium encoded with programming instructions, said data storage medium being loaded into a control and processing system of a magnetic resonance apparatus that also comprises a magnetic resonance data acquisition unit and said magnetic resonance data acquisition unit comprising a radio-frequency system and a gradient system, said programming instructions causing said control and evaluation system to:

a control unit configured to operate said magnetic resonance data acquisition unit to acquire magnetic resonance data with a pulse sequence that includes radiating, with said radio-frequency system, at least one non-selective excitation pulse and that includes activating, with said gradient system, a magnetic field gradient during radiation of said at least one non-selective excitation pulse;

receive a first parameter that indicates a field of view that is desired in acquisition of magnetic resonance data using said pulse sequence;

receive a second parameter that designates a maximum gradient field strength that corresponds to a maximum gradient field strength applied during an entirety of said magnetic resonance data acquisition;

automatically calculate a maximum pulse length of said at least one non-selective excitation pulse in said sequence from said first parameter and said second parameter; and make the calculated maximum pulse length available in an electronic form.

* * * * *